United States Patent [19]

Millar

[11] Patent Number: 4,593,398

[45] Date of Patent: Jun. 3, 1986

[54] ADAPTIVE DIFFERENTIAL PCM SYSTEM WITH RESIDUAL-DRIVEN ADAPTATION OF FEEDBACK PREDICTOR

[75] Inventor: Douglas J. Millar, Verdun, Canada

[73] Assignee: Northern Telecom Limited, Montreal, Canada

[21] Appl. No.: 546,738

[22] Filed: Oct. 28, 1983

[30] Foreign Application Priority Data

Jul. 18, 1983 [CA] Canada ................................. 432615

[51] Int. Cl.[4] ........................................... H03M 7/38
[52] U.S. Cl. ...................................... 375/27; 375/30; 375/122; 332/11 D; 364/724
[58] Field of Search ....................... 375/26, 27, 33, 34, 375/122; 332/9 R, 11 R, 11 D; 358/13; 364/724; 381/34, 35; 340/347 AD

[56] References Cited

U.S. PATENT DOCUMENTS

| | | | |
|---|---|---|---|
| 4,317,208 | 2/1982 | Araseki et al. | 375/27 |
| 4,319,360 | 3/1982 | Cointot | 375/27 |
| 4,354,273 | 10/1982 | Araseki et al. | 375/27 |
| 4,389,726 | 6/1983 | Le Guyader et al. | 375/27 |
| 4,475,227 | 10/1984 | Belfield | 375/27 |

Primary Examiner—Robert L. Griffin
Assistant Examiner—Raymond C. Glenny
Attorney, Agent, or Firm—Thomas Adams

[57] ABSTRACT

An adaptive differential pulse code modulation system (ADPCM), with adaptive prediction, has a transmitter, which substracts the output of its predictor from the original input signal and transmits a numeric representation of the quantized difference, and a receiver which reconstructs the original input signal by the reverse process. Mistracking, whereby the receiver fails to faithfully reproduce the original input signal because its pole-based predictor coefficients differ from those of the transmitter predictor, which can result from transmission errors when the original signal comprises two pure tones, is avoided by eliminating the dependence of the adaptation process upon the predictor output. This is achieved by deriving the coefficients using the difference signal but not the reconstructed signal. In particular the prediction coefficients may be derived in accordance with the expression $$A_i^{j+1} = A_i^j(1 - \delta_i) + g \cdot F_i(E_j, E_{j-1}, \ldots E_{j-n}, A_1^j \ldots A_{i-1}^j).$$

60 Claims, 4 Drawing Figures

ADAPTIVE DIFFERENTIAL PCM SYSTEM WITH RESIDUAL-DRIVEN ADAPTATION OF FEEDBACK PREDICTOR

The invention relates to differential pulse code modulation systems and in particular such systems having adaptive prediction coefficients.

The invention is particularly concerned with adaptive differential pulse code modulation (ADPCM) systems of the kind exemplified as prior art in U.S. Pat. No. 4,317,208, issued Feb. 23, 1982 to Takashi Araseki, which is incorporated herein by reference. Generally such systems include a transmitter in which a subtractor provides the difference between the instant signal sample and a prediction signal derived from one or more earlier samples. The difference signal is then quantized and transmitted. The receiver includes an inverse quantizer and a predictor which reconstruct the signal from the received difference or residual signal. Usually the quantizers will be adaptive so as to vary the step size, or transfer function slope, according to the magnitude of the input difference signal. This better utilizes the dynamic range of the quantizer and improves response to low amplitude signals.

Additionally, each predictor may be adaptive, i.e. its coefficients change with time, to better follow the variations with time of the signal to be predicted, and to optimize performance with different types of signal, for example voice, voiceband data. In effect the predictor transfer function is adapted to the time varying input signal so that, ideally, the energy in the difference or residual signal is minimized at all times. In ADPCM systems, the values of the predictor coefficients are not transmitted explicitly to the receiver, but are derived from the quantized difference signal in an identical manner in both the transmitter and the receiver.

One type of predictor, known as "pole-based", uses a feedback loop and derives its coefficients according to the equation:

$$A_i^{j+1} = A_i^j + g \cdot F_1(\hat{X}_{j-i}) \cdot F_2(\hat{E}_j) \qquad 1$$

where $A_i^j$ is the ith predictor coefficient at sample time j. $\hat{X}_{j-i}$ is the reconstructed signal delayed i samples, $\hat{E}_j$ is the quantized difference between the input signal and the predicted value, g is a small positive value and $F_1$ and $F_2$ are non-decreasing functions. As discussed in U.S. Pat. No. 4,317,208, in such systems the coefficients of the receiver differ from those of the transmitter if transmission errors occur. This is because the prediction coefficients in the receiver are derived from the received difference signal. Errors in this signal cause the receiver prediction coefficients to depart from those in the transmitter. The difference or mistracking may persist even when the errors have ceased.

It has been proposed to alleviate this problem by deriving the prediction coefficients $A_i$ according to the equation:

$$A_i^{j+1} = A_i^j(1-\delta) + g \cdot F_1(\hat{X}_{j-i}) F_2(\hat{E}_j) \qquad 2$$

where $i = 1$ to N, $\delta$ is a positive value much smaller than 1, g is a proper positive constant, $\hat{X}_{j-i}$ is the reconstructed signal delayed i samples, $\hat{E}_j$ is the quantized difference between the input signal and the prediction signal and $F_1$ and $F_2$ are non-decreasing functions.

Inclusion of the term $(1-\delta)$ is intended to cause the receiver's predictor coefficient values to gradually converge to those of the transmitter predictor at a rate determined by $\delta$. This desirable property is termed tracking of the receiver predictor coefficients.

Even so, instability or oscillation of the receiver may still occur because of the feedback loop in the predictor which uses both the difference signal $\hat{E}_j$ and the preceding reconstructed signal $\hat{X}_{j-i}$ to derive the predictor coefficients. Usually stability checking is used to ensure that the predictor coefficients remain within prescribed ranges. A drawback of such stability checking is the increased complexity as the number of poles (coefficients) increases.

In U.S. Pat. No. 4,317,208, Araseki proposes overcoming the stability problem by using a zero-based predictor, i.e. which does not have a feedback loop. However, whilst such zero-based predictors are not susceptible to instability, they do suffer from the disadvantage that they provide less prediction gain for speech and like signals than pole-based predictors. It is possible to use both a pole-based predictor and a zero-based predictor, as suggested by Araseki, to gain the advantages of each. However, it has been found that, whether combined with a zero-based predictor or not, a pole-based predictor is still vulnerable to mistracking if the input signal contains two tones of equal amplitude but different frequency. A particular problem arises with the tones used for dual tone multiple frequency (DTMF) signalling in the telephone network, but a problem may also arise with some modems which use tones differing by more than about 300 Hz. When such signals the predictor adaptation driven via the feedback loop by the predictor output signal, may have multiple stable states. Thus, once transmission errors have produced mistracking, the receiver may stabilize with its predictor coefficients at values different from those of the transmitter. Its transfer function, which is normally the inverse of that of the transmitter, will have a distorted frequency response, so one tone will be attenuated and the other amplified, possibly to an extent that the inequality is unacceptable.

In summary, zero-based predictors overcome the problems of instability and mistracking, but suffer from lower predictor gain. Pole-based predictors can be made stable by applying a stability check, but hitherto have suffered from mistracking.

The present invention seeks to mitigate this problem and to this end according to one aspect provides an adaptive differential pulse code modulation system comprising:

a transmitter including; a subtractor for deriving the difference ($E_j$) between an input signal ($X_j$) and a transmitter predicted value ($\dot{X}_j$), a quantizer for quantizing the difference signals $E_j$ from said subtractor to obtain a numeric representation ($N_j$) thereof;

an inverse quantizer for regenerating the (quantized) difference signal $\hat{E}_j$ from said numeric representation ($N_j$);

summing means for summing the difference signal $\hat{E}_j$ and the transmitter predicted value $\hat{X}_j$ to provide a transmitter reconstructed signal $\hat{X}_j$;

predictor means having variable prediction coefficients for receiving the output of said summing means and generating therefrom said predicted value;

a feedback loop for applying said predicted value to said summing means;

a receiver comprising an inverse quantizer for recovering the receiver quantized difference signal ($\hat{E}_j$) from the received numeric representation;

an adder for combining a receiver predicted value and a receiver quantized difference signal $\hat{E}_j$ to provide a receiver reconstructed signal $\hat{X}_j$; and receiver predictor means having variable prediction coefficients, for receiving said reconstructed signal and providing therefrom said receiver predicted value.

Each predictor coefficient is derived as constant less than one times its immediate past value plus a non-linear function dependent upon a finite number of past values of the quantized difference signal ($\hat{E}_j$).

Where the predictor has a plurality of coefficients, corresponding to past values of the reconstructed signal occurring at different times, the corresponding non-linear function may be dependent also upon the immediate past coefficient values of one or more lower numbered predictor coefficients. It may not derive from any other, so precluding the function being derived from the predicted value or from the reconstructed signal. The numbering of coefficients for this purpose is arbitrary, but they are typically ordered such that higher numbered coefficients correspond to earlier past values of the reconstructed signal. Thus the first or lowest numbered predictor coefficient will not be a non-linear function of any past coefficient value. This is in contrast to prior implementations, such as that by Araseki, wherein this function is derived in part from the reconstructed signal $\hat{X}_j$, which derives in turn from the predicted value $\hat{X}_j$, which derives from all of the immediate past coefficient values.

More particularly the predicted values $X_j$ are derived in accordance with the equation:

$$\hat{X}_{jp} = A_1\hat{X}_{j-1} + A_2\hat{X}_{j-2} \cdots + A_n\hat{X}_{j-n} \qquad 3$$

where $A_1$ to $A_n$ are the individual predictor coefficients $A_i$ derived in accordance with the equation:

$$A_i^{j+1} = A_i^j(1 - \delta_i) + g \cdot F_i(\hat{E}_j, \hat{E}_{j-1}, \cdots \hat{E}_{j-n}, A_1^j \cdots A_{i-1}^j) \qquad 4$$

where $i = 1 \ldots n$, the number of pole-predictor coefficients.

$\delta_i$ is a positive constant much smaller than one $g$ is a proper positive constant $E_j$ is the value of the (quantized) difference signal at time point $j$ and $A_i^j$ is the respective predictor coefficient at time point $j$, and $F_i$ is a non-linear function $\hat{X}'_j$ is the sum of the difference signal $\hat{E}_j$ and the predicted value $\hat{X}_j$.

It should be noted that for the case $i = 1$, i.e. the first or only pole, there are no A arguments. Some, but not all, of the $\hat{E}_j$ or $A_i^j$ terms may be omitted.

In a preferred embodiment having a two pole predictor the two predictor coefficients $A_1$ and $A_2$ are derived in accordance with the equations:

$$A_1^{j+1} = A_1^j(1 - \delta_1) + g_1 \cdot \hat{E}_j \cdot \hat{E}_{j-1}/K_j \qquad 5$$

$$A_2^{j+1} = A_2^j(1 - \delta_2) + g_2 \cdot [\hat{E}_j \cdot \hat{E}_{j-2} - A_1^j \cdot \hat{E}_j \cdot \hat{E}_{j-1}]/K_j \qquad 6$$

where $j$ is a particular sample period, $\delta_1$ and $\delta_2$ are positive values much smaller than 1 (e.g. 1/256 and 1/128, respectively);

$d$ is a small positive constant;

$g_1$ and $g_2$ are proper positive constants, for example each 1/32; and $K = \text{Max}(d, \hat{E}_j^2, \hat{E}_{j-1}^2, \hat{E}_{j-2}^2)$ The aforementioned embodiments of the invention, (with a pole-based predictor) may be used alone or with an additional predictor not employing feedback (zero-based). When such an additional predictor is provided, it may also be preferable to derive the prediction coefficients for the pole-based predictor not only from the difference signal, but also from the output of the zero-based predictor, i.e. from the partially reconstructed input signal.

The invention will be readily understood from the following description taken in conjunction with the accompanying drawings, in which.

Figure 1:
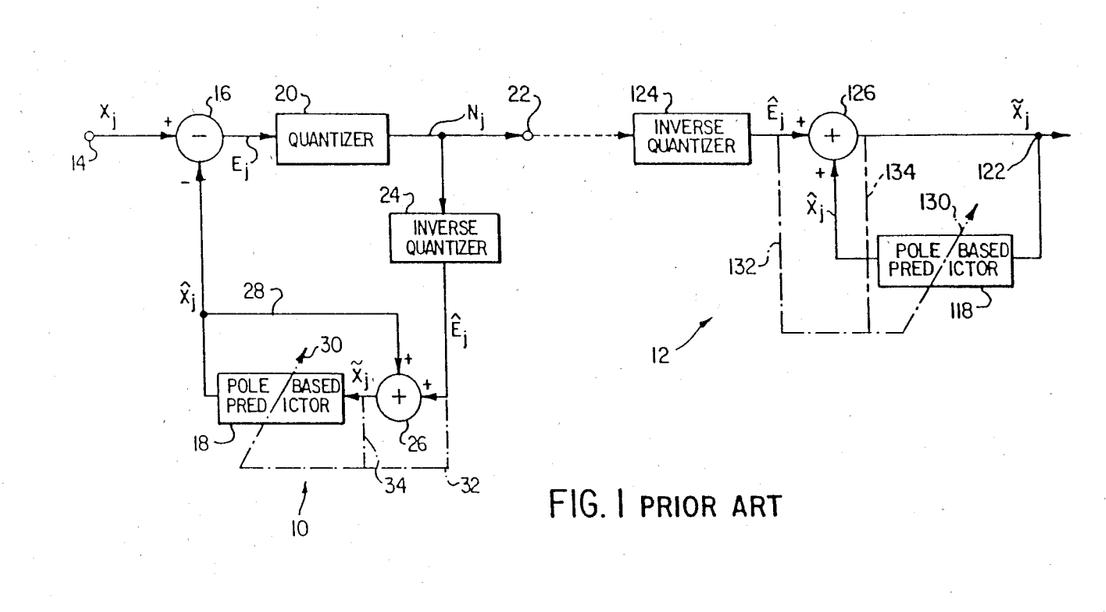
FIG. 1 is a schematic representation of an ADPCM system according to the PRIOR ART.

Referring to FIG. 1, a conventional adaptive differential pulse code modulation system (ADPCM) with adaptive prediction comprises a transmitter 10 and a receiver 12. A digital signal to be transmitted is applied to an input terminal 14 of the transmitter 10. The signal is represented as $X_j$, signifying it is applied at time point or sample period $j$. The input terminal 14 is connected to a subtractor 16, which provides a difference signal $E_j$ obtained by subtracting from the input signal $X_j$ the output $\hat{X}_j$ of a pole-based predictor 18. The difference signal $E_j$ is quantized by a quantizer 20 to provide a corresponding numeric representation $N_j$ at transmitter output terminal 22 for transmission to the receiver 12.

Generally the quantizer 20 will be adaptive i.e. its step size or transfer function will vary according to the input signal magnitude. Such quantizers are known and so will not be described in detail here. It should be noted that although an adaptive quantizer is preferred, a fixed quantizer might be used instead.

The numerical representation $N_j$ is also applied to an inverse quantizer 24 which regenerates the difference signal $\hat{E}_j$. Naturally, the characteristics of the inverse quantizer 24 must match those of the quantizer 20, and so will be adaptive if quantizer 20 is adaptive.

An adder 26 sums the regenerated difference signal $\hat{E}_j$ with the predictor output signal or predicted value $\hat{X}_j$ to provide a reconstructed input signal $\hat{X}_j$ at the input of predictor 18. The pole-based predictor 18 has a feedback loop 28 which applies the predictor output $\hat{X}_j$ to the adder 26. The predictor 18 derives the signal $\hat{X}_j$ using past input signal values in accordance with the equation:

$$\hat{X}_j = A_1\hat{X}_{j-1} + A_2\hat{X}_{j-2} \cdots + A_n\hat{X}_{j-n} \qquad 3.$$

where $A_1$-$A_n$ are prediction coefficients.

The predictor coefficients are adaptively corrected, as signified by arrow 30, in dependence upon the regenerated difference signal $\hat{E}_j$, as signified by the broken line 32, and upon the previously reconstructed input signal $\hat{X}_j$, as signified by the broken line 34. More specifically, the coefficients $A_i^j$ are adaptively corrected in accordance with the equation:

$$A_i^{j+1} = A_i^j(1 - \delta_i) + g \cdot F_1(\hat{X}_{j-i}) F_2(\hat{E}_j) \quad \text{3a.}$$

where g is a positive small value and $F_1$ and $F_2$ are non-decreasing functions.

The receiver 12 comprises an inverse quantizer 124, and a pole-based predictor 118, corresponding to inverse quantizer 24 and predictor 18 in the transmitter 10. The receiver inverse quantizer 124 receives the numerical representation $N_j$ from the transmitter 10 and produces therefrom the regenerated difference signal $\hat{E}_j$. An adder 126 sums the output signal $\hat{X}_j$ from the predictor 118 with the difference signal $\hat{E}_j$ to produce the reconstructed input signal $\hat{X}_j$ at the output terminal 122 of the receiver 12. This signal $\hat{X}_j$ is also applied to the input of predictor 118.

The coefficients of receiver predictor 118 are adaptively corrected in like manner to those of the transmitter predictor 18 as indicated by corresponding broken lines 132 and 134.

The receiver 12 operates in the inverse manner to the transmitter 10 and will faithfully reconstruct the original signal so long as the predictor coefficients are the same in both predictors 18 and 118 at any instant in time. The receiver and transmitter are then said to be "tracking". As mentioned previously, however, in practice errors will occur in the transmission between the transmitter and the receiver. These errors will result in differences between the prediction coefficients of the predictors 18 and 118 so the receiver output will no longer faithfully reproduce the original signal. In most cases, once the errors have ceased, the coefficients in the receiver will realign with those in the transmitter. The mechanisms whereby this is achieved are stability checks which restrict the range of the predictor and the leakage factor $(1-\delta)$ so that they will converge. There is a limit to the extent to which these mechanisms can be applied whilst assuring adequate predictor performance.

It has been found that "mistracking" can occur, however, when the input signal comprises two tones of different frequency. "Mistracking" is a situation arising when the transmission errors have ceased and the prediction coefficients in the transmitter and receiver have stabilized, but are not the same. The effect then is to amplify one tone and attenuate the other.

In embodiments of the present invention the problem is overcome by not using the reconstructed input signal $\hat{X}_j$ to adjust the predictor coefficients. Thus, referring to FIG. 2, which illustrates a first embodiment of the invention, the component parts of the transmitter 10A and receiver 12A are the same as those illustrated in FIG. 1 and so for ease of description corresponding parts are identified by the same reference numeral. It should be noted, however, that in FIG. 2 there are no broken lines corresponding to lines 34 and 134 in FIG. 1. This is because the prediction coefficients are no longer dependent upon $\hat{X}_j$, the reconstructed input signal.

Figure 2:
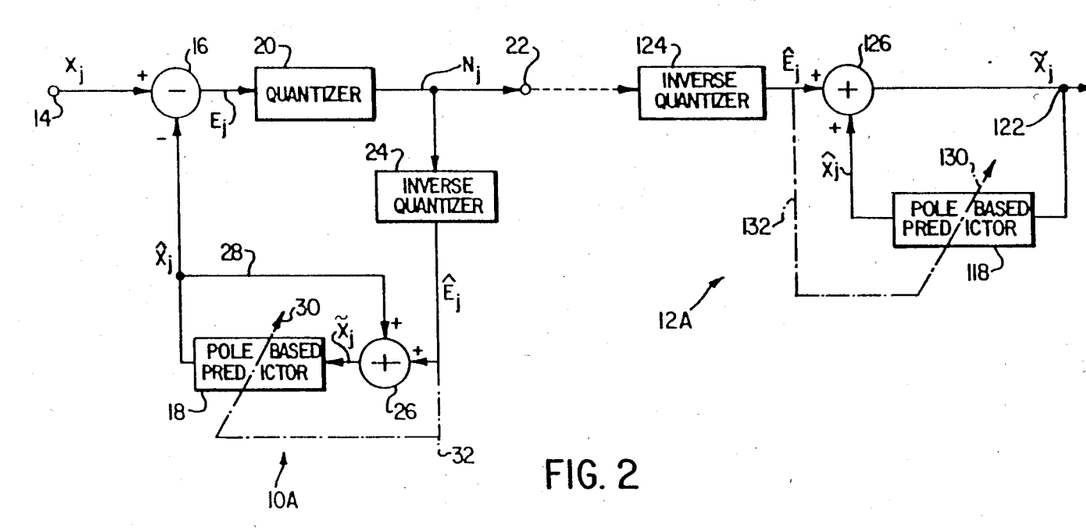
FIG. 2 is a schematic representation of a first exemplary embodiment of the invention.

In the embodiment shown in FIG. 2, the predictor coefficients are derived in accordance with the general equation:

$$A_i^{j+1} = A_i^j(1 - \delta_i) + g \cdot F_i(\hat{E}_j, \hat{E}_{j-1}, \hat{E}_{j-n}, A_1^j - A_{i-1}^j) \quad 4.$$

where i is the number of the coefficient from 1 to n, the higher numbers corresponding to earlier time values.

$\delta_i$ is a positive constant much smaller than one;

g is a proper positive constant;

$\hat{E}_j$ is the value of the difference signal at time point j;

$A_i^j$ is the respective preditor coefficient at time point j; and $F_i$ is a non-linear function.

It should be noted that when i=1, the function $F_i$ will not have any arguments $A_1$-$A_{i-1}$.

This approach to adapting the predictor coefficients avoids any dependence upon the output at the predictor $\hat{X}_j$ in the receiver so that mistracking due to dual tones is avoided. The main features guaranteeing tracking are:

(a) $F_i$ depends on a finite number n of past values of the difference signal $\hat{E}_j$.

(b) $F_i$ depends on $A_k^j$ only up to k=i-1 (Thus $A_i^j$ does not depend on any $A_k$).

In these equations for coefficients $A_i$, the first term is a linear decay term to allow effects of transmission errors to die away, and the second term is the adaptation term. Whilst a system for transmitting signals, such as speech, over telecommunications networks will usually require the first term, it should be appreciated that the $\delta_i$ constant might be omitted in some ADPCM system applications.

Although the system illustrated in FIG. 2 can be used with only one pole, or several poles, it is preferred to use two poles in the predictors 18 and 118.

In such a case, the predictor coefficients $A_1$ and $A_2$ are derived according to the equations:

$$A_1^{j+1} = A_1^j(1 - \delta_1) + g_1 \cdot \hat{E}_j \cdot \hat{E}_{j-1}/K_j \quad 11.$$

$$A_2^{j+1} = A_2^j(1 - \delta_2) + g_2 \cdot [\hat{E}_j \cdot \hat{E}_{j-2} - A_1^j \cdot \hat{E}_j \cdot \hat{E}_{j-1}]/K_j \quad 12.$$

where $K_j$=Max (d, $\hat{E}_j^2$, $\hat{E}_{j-1}^2$, $\hat{E}_{j-2}^2$)

$\delta_1$ and $\delta_2$ are positive values much smaller than 1 (for example 1/256 and 1/128, respectively).

$g_1$, $g_2$ and d are proper positive constants, e.g. 1/32, 1/32 and $10^{-6}$, respectively.

The values for $g_1$ and $g_2$ are chosen depending upon the characteristics of the signal and those specified are typically suitable for speech. Other values may be used providing the ratios of $\delta_1$:$g_1$ and $\delta_2$:$g_2$ are maintained about 1:8 and 1:4, respectively.

A particularly economic implementation of the invention can be achieved by approximating the coefficient equations as follows:

$$A_1^{j+1} = A_1^j(1 - \delta_1) + g_1 \, \text{sgn}(\hat{E}_j) \, \text{sgn}(\hat{E}_{j-1}) \quad 13.$$

$$A_2^{j+1} = A_2^j(1 - \delta_2) + g_2 \, [\text{sgn}(\hat{E}_j) \, \text{sgn}(\hat{E}_{j-2}) - \quad 14.$$

$$f(A_1^j) \, \text{sgn}(\hat{E}_j) \, \text{sgn}(\hat{E}_{j-1})]$$

where $f(A_1^j) = 2 \, \text{sgn}(A_1^j)$ if $|A_1^j| > \frac{1}{2}$     15.

$= 4 A_1^j$ otherwise and $\delta_1$ and $\delta_2$ are about 1/181 and 1/90, respectively, and $g_1$ and $g_2$ are 1/64 and 1/90, respectively.

These values for $g_1$ and $g_2$ are typically suitable for speech signals. Other values may be used depending upon the characteristics of the signal, providing the ratios of $\delta_1$:$g_1$ and $\delta_2$:$g_2$ are maintained at about 1:2$\sqrt{2}$ and unity, respectively.

Figure 3:
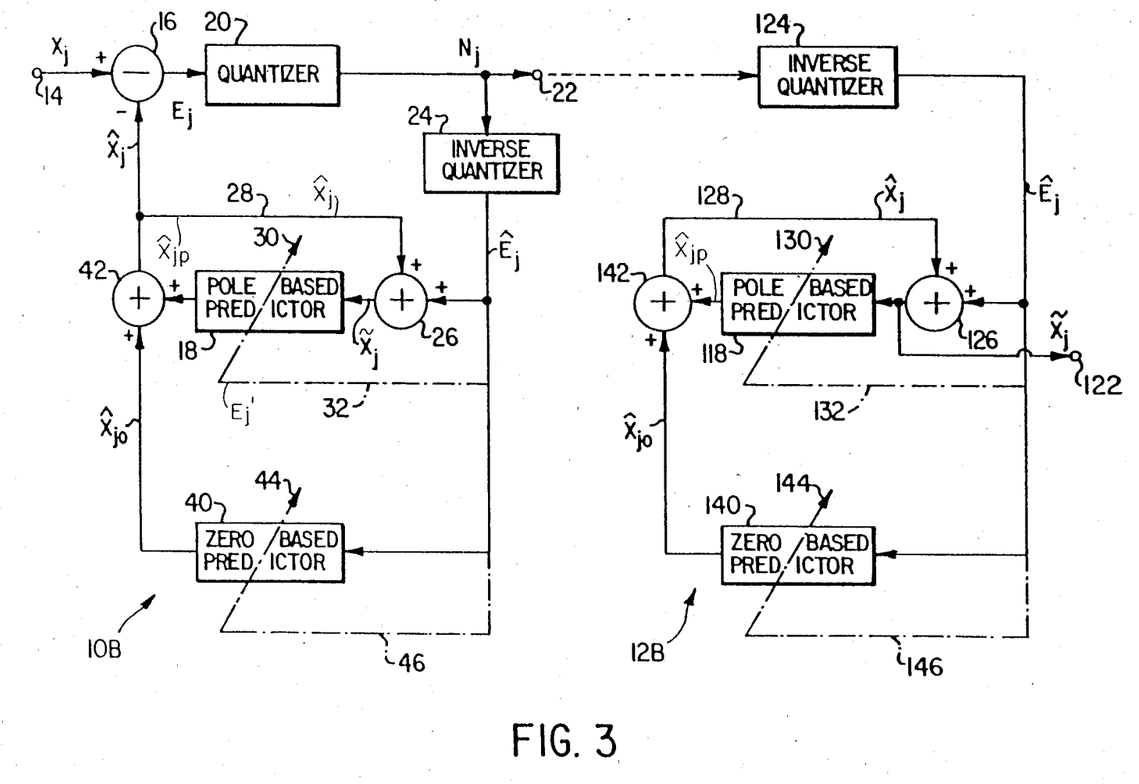
FIG. 3 is a schematic representation of a second exemplary embodiment of the invention.

In many applications satisfactory results will be obtained using the embodiment shown in FIG. 2. However, in some cases, to maximize the signal to noise ratio for certain input signals, an additional predictor, not using feedback, may be added. Such an embodiment is illustrated in FIG. 3, in which parts corresponding to those shown in FIG. 2, have the same reference numeral.

The transmitter 10B differs from that in FIG. 2 by the addition of a zero-based predictor 40 (having no feedback) which produces from the regenerated difference signal $\hat{E}_j$ a partial predicted value $\hat{x}_{jo}$. A second adder 42 sums the outputs of the zero-based predictor 40 and the pole-based predictor 18 to produce the predicted value $\hat{X}_j$. It should be noted that the coefficients of predictor 40, adaptive as signified by arrow 44, are adaptive only in dependence upon difference signal $\hat{E}_j$ as signified by broken line 46 and it has no feedback loop. A corresponding predictor 140 and adder 142 are provided in the receiver 12B.

It is envisaged that where predictor 18 has two coefficients, the zero-based predictor 40 might have six coefficients. The zero-based predictor coefficients may be derived in accordance with the teachings of U.S. Pat. No. 4,317,208.

Where an additional predictor 40 is provided, the coefficients of the pole-based predictor 18 may be adapted in dependence upon the output of the additional predictor 40, as well as the difference signal $\hat{E}_j$.

Figure 4:
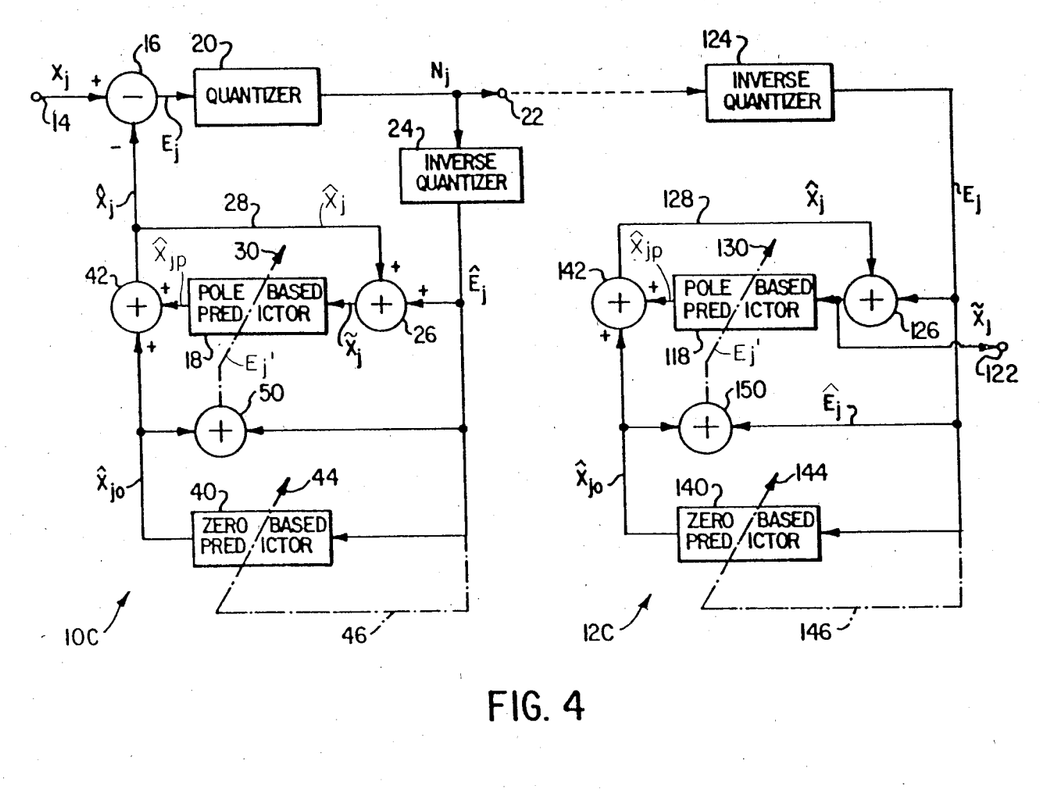
FIG. 4 is a schematic representation of a third exemplary embodiment of the invention.

Such an arrangement is illustrated in FIG. 4, in which the transmitter 10C differs from FIG. 3 by the inclusion of a third adder 50 which sums the difference signal $\hat{E}_j$ and the partial predicted value $\hat{X}_{jo}$ at the output of the zero-based predictor 40 to provide an adaptation signal which controls adaptation of the coefficients of the pole-based predictor 18. The receiver 12C has a corresponding third adder 150 connected in like manner.

In both the transmitter and receiver, the equations for deriving the coefficients will be the same as for other embodiments, except that the term $\hat{E}_j$ is replaced by $\tilde{E}_j$, defined as the sum of the difference signal $\hat{E}_j$ and the partial predicted value $\hat{X}_{jo}$.

What is claimed is:

1. An adaptive differential pulse code modulation system comprising:
    a transmitter including; a subtractor for deriving the difference $E_j$ between an input signal $X_j$ and a transmitter predicted value $\hat{X}_j$, a quantizer for quantizing the difference signal $E_j$ from said subtractor to obtain a numeric representation $N_j$ thereof;
    an inverse quantizer for regenerating the difference signal $\hat{E}_j$ from said numeric representation $N_j$;
    summing means for summing the difference signal $\hat{E}_j$ and the transmitter predicted value $\hat{X}_j$ to provide a transmitter reconstructed signal $\tilde{X}_j$;
    predictor means having variable prediction coefficients for receiving the transmitter reconstructed signal $\tilde{X}_j$ from said summing means and generating therefrom a predictor output signal $\hat{X}_{jp}$ comprising at least partially said transmitter predicted value $\hat{X}_j$;
    a feedback loop for applying said transmitter predicted value $\hat{X}_j$ to said summing means;
    a receiver comprising an inverse quantizer for regenerating the receiver quantized difference signal $\hat{E}_j$ from the received numeric representation $N_j$;
    an adder for combining a receiver predicted value and a receiver quantized difference signal $\hat{E}_j$ to provide a receiver reconstructed signal $\tilde{X}_j$;
    receiver predictor means having variable prediction coefficients, for receiving said receiver reconstructed signal and providing therefrom a receiver predictor output comprising at least partially said receiver predicted value;
    said predictor means in said transmitter and receiver, respectively, each being arranged to derive its predictor output signal $\hat{X}_{jp}$ in accordance with the equation:

$$\hat{X}_{jp} = A_1[X'_{j-1}]\tilde{X}_{j-1} + A_2[X'_{j-2}]\tilde{X}_{j-2} \cdots + A_n[X'_{j-n}]\tilde{X}_{j-n}^3$$

wherein $A_1$–$A_n$ are the predictor coefficient values in said transmitter and receiver defined by:

$$A_i^{j+1} = A_i^j(1 - \delta_i) + g \cdot F_i(\hat{E}_j, \hat{E}_{j-1}, \cdots \hat{E}_{j-n}, A_1^j \cdots A_{i-1}^j) \quad 4$$

where i=the number of the particular predictor coefficient, $=1 \ldots n$ where n is the number of coefficients;
    $\delta_i$ is a positive constant much smaller than one;
    g is a proper positive constant;
    $\hat{E}_j$ is the value of the quantized difference signal at time point j;
    $A_i^j$ is the respective predictor coefficient at time point j;
    $F_i$ is a non-linear function;
    $\tilde{X}_j$ is the sum of the difference signal $\hat{E}_j$ and the predicted value $\hat{X}_j$.

2. An adaptive differential pulse code modulation system comprising:
    a transmitter including; a subtractor for deriving the difference $E_j$ between an input signal $X_j$ and a transmitter predicted value $\hat{X}_j$, a quantizer for quantizing the difference signal $E_j$ from said subtractor to obtain a numeric representation $N_j$ thereof;
    an inverse quantizer for regenerating the difference signal $\hat{E}_j$ from said numeric representation $N_j$;
    summing means for summing the difference signal $\hat{E}_j$ and the predicted value $\hat{X}_j$ to provide a transmitter reconstructed signal $\tilde{X}_j$;
    predictor means having variable prediction coefficients for receiving the reconstructed signal $\tilde{X}_j$ from said summing means and generating therefrom a transmitter predictor output signal $\hat{X}_{jp}$ comprising at least partially said predicted value $\hat{X}_j$;
    a feedback loop for applying said transmitter predicted value $\hat{X}_j$ to said summing means;
    a receiver comprising an inverse quantizer for regenerating the receiver quantized difference signal $\hat{E}_j$ from the received numeric representation $N_j$;
    an adder for combining a receiver predicted value and a receiver quantized difference signal $\hat{E}_j$ to provide a receiver reconstructed signal $\tilde{X}_j$;
    receiver predictor means having variable prediction coefficients, for receiving said receiver reconstructed signal and providing therefrom a receiver predictor output comprising at least partially said receiver predicted value;
    said predictor means in said transmitter and receiver, respectively, each being arranged to derive each prediction coefficient using an equation consisting essentially of a decay term and a non-linear function having at least one set of arguments comprising a finite number of past values of said difference signal $E_j$ and having no arguments comprising the value of said reconstructed signal $X_j$.

3. A system as defined in claim 1 or 2, wherein said predictors each have two predictor coefficients $A_1$ and $A_2$ derived in accordance with the equations:

$$A_1^{j+1} = A_1^j (1 - \delta_1) + g_1 \cdot E_j \cdot E_{j-1}/K_j \quad 4$$

$$A_2^{j+1} = A_2^j (1 - \delta_2) + g_2 \cdot [E_j \cdot E_{j-2} - A_1^j \cdot E_j \cdot E_{j-1}]/K_j \quad 5$$

$$K_j = \mathrm{Max}\,(d,\ E_j^2,\ E_{j-1}^2,\ E_{j-2}^2)$$

where
- $j$ is a particular sample period;
- $\delta_1$ and $\delta_2$ are positive values much smaller than 1;
- $g_1$ and $g_2$ and $d$ are proper positive constants.

4. An adaptive differential pulse code modulation system as defined in claim 3, wherein each first said predictor means provides a part only of the predicted value and said transmitter and said receiver each further comprise:
- second predictor means having variable coefficients and no feedback loop for providing from the regenerated difference signal ($E_j$) a partial predicted value ($X_{jo}$) and
- a second adder for summing the output of the first-mentioned predictor means and the partial predicted value to provide said predicted value.

5. A system as defined in claim 3, wherein the constants $\delta_1$, $\delta_2$, $g_1$ and $g_2$ are determined such that the ratios $\delta_1:g_1$ and $\delta_2:g_2$ are about 1:8 and 1:4, respectively.

6. A system as defined in claim 5, wherein the constants $g_1$ and $g_2$ are substantially equal.

7. A system as defined in claim 6, wherein the constants $\delta_1$, $\delta_2$, $g_1$ and $g_2$ are substantially equal to 1/256, 1/128, 1/32 and 1/32, respectively.

8. A system as defined in claim 1 or 2, wherein said predictors each have two predictor coefficients $A_1$ and $A_2$ derived in accordance with the equations:

$$A_1^{j+1} = A_1^j (1 - \delta_1) + g_1\,\mathrm{sgn}\,(E_j)\,\mathrm{sgn}\,(E_{j-1}) \quad 8$$

$$A_2^{j+1} = A_2^j (1 - \delta_2) + g_2\,[\mathrm{sgn}\,(E_j)\,\mathrm{sgn}\,(E_{j-2}) - f(A_1^j)\,\mathrm{sgn}\,(E_j)\,\mathrm{sgn}\,(E_{j-1})] \quad 9$$

where $f(A_1^j) = 2\,\mathrm{sgn}\,(A_1^j)$ if $|A_1^j| > \tfrac{1}{2}$    10

$= 4 A_1^j$ otherwise.

9. An adaptive differential pulse code modulation system as defined in claim 8, wherein each first said predictor means provides a part only of the predicted value and said transmitter and said receiver each further comprise:
- second predictor means having variable coefficients and no feedback loop for providing from the regenerated difference signal ($E_j$) a partial predicted value ($X_{jo}$) and
- a second adder for summing the output of the first-mentioned predictor means and the partial predicted value to provide said predicted value.

10. A system as defined in claim 8, wherein the constants $\delta_1$, $\delta_2$, $g_1$ and $g_2$ are determined such that the ratios $\delta_1:g_1$ and $\delta_2:g_2$ are about $1:2\sqrt{2}$ and unity, respectively.

11. A system as defined in claim 10, wherein the constants $\delta_1$, $\delta_2$, $g_1$ and $g_2$ are about 1/181, 1/90, 1/64 and 1/90, respectively.

12. An adaptive differential pulse code modulation system as defined in claim 1, wherein each first said predictor means provides a part only of the predicted value and said transmitter and said receiver each further comprise:
- second predictor means having variable coefficients and no feedback loop for providing from the regenerated difference signal ($E_j$) a partial predicted value ($X_{jo}$) and
- a second adder for summing the output of the first-mentioned predictor means and the partial predicted value to provide said predicted value.

13. An adaptive differential pulse code modulation system comprising:
- a transmitter including; a subtractor for deriving the difference $E_j$ between an input signal $X_j$ and a transmitter predicted value $X_j$, a quantizer for quantizing the difference signal $E_j$ from said subtractor to obtain a numeric representation $N_j$ thereof;
- an inverse quantizer for regenerating the difference signal $E_j$ from said numeric representation $N_j$;
- first summing means for summing the difference signal $E_j$ and the transmitter predicted value $X_j$ to provide a transmitter reconstructed signal $X_j$;
- first predictor means having variable prediction coefficients for receiving the output $X_j$ of said summing means and generating therefrom a transmitter predictor output signal $X_{jp}$ comprising a part of said predicted value $X_j$;
- a feedback loop for applying said transmitter predicted value $X_j$ to said first summing means;
- a receiver including an inverse quantizer for recovering a receiver quantized difference signal ($E_j$) from a received numeric representation ($N_j$);
- first receiver summing means for combining a receiver predicted value and a receiver quantized difference signal ($E_j$) to provide a receiver reconstructed signal ($X_j$);
- first receiver predictor means having variable prediction coefficients, for receiving said receiver reconstructed signal and providing therefrom a receiver predictor output signal ($X_{jp}$) comprising a part of said receiver predicted value ($X_j$);
- a feedback loop for applying said receiver predicted value ($X_j$) to said first receiver summing means;
- the transmitter and the receiver each comprising:
- second predictor means having variable coefficients and no feedback loop for providing from the regenerated difference signal ($E_j$) a partial predicted value ($X_{jo}$);
- a second summing means for summing the respective outputs $X_{jp}$ and $X_{jo}$ of the first-mentioned predictor means and said second predictor means to provide said predicted value $X_j$;
- a third summing means for deriving the sum $E'_j$ of the quantized difference signal $E_j$ and the partial predictor output $X_{jo}$ of the second predictor means;
- each said first predictor being arranged to derive its predictor output $X_{jp}$ in accordance with the equation:

$$X_{jp} = A_1[X'_{j-1}]\underline{X_{j-1}} + A_2[X'_{j-2}]\underline{X_{j-2}} \cdots + A_n[X'_{j-n}]\underline{X_{j-n}}^3$$

wherein $A_1$–$A_n$ are the predictor coefficient values in said transmitter and receiver defined by:

$$A_i^{j+1} = A_i^j(1 - \delta_i) + g \cdot F_i(E_j', E_{j-1}', \cdots E_{j-n}', A_1^j \cdots A_{i-1}^j) \quad 4$$

where
- i = the number of the particular predictor coefficient;
- = 1–n where n is the number of coefficients;
- $\delta_i$ is a positive constant much smaller than one;
- g is a proper positive constant;
- $E'_j$ is the sum of the quantized difference signal $E_j$ at time j and the output $X_{jo}$ of said second predictor means;
- $A_i^j$ is the respective predictor coefficient at time point j;
- $F_i$ is a non-linear function;
- $X_j$ is the sum of the difference signal $E_j$ and the predicted value $X_j$.

14. A system as defined in claim 13, wherein said first predictors each have two predictor coefficients $A_1$ and $A_2$ derived in accordance with the equations:

$$A_1^{j+1} = A_1^j (1 - \delta_1) + g_1 \cdot E'_j \cdot E'_{j-1}/K_j \quad 11$$

$$A_2^{j+1} = A_2^j (1 - \delta_2) + g_2 \cdot [E'_j \cdot E'_{j-2} - A_1^j \cdot E'_j \cdot E'_{j-1}]/K_j \quad 12$$

$$K_j = \text{Max}(d, E'^2_j, E'^2_{j-1}, E'^2_{j-2})$$

where
- j is a particular sample period;
- $\delta_1$ and $\delta_2$ are positive values much smaller than 1;
- $g_1$ and $g_2$ and d are proper positive constants.

15. A system as defined in claim 14, wherein the constants $\delta_1$, $\delta_2$, $g_1$ and $g_2$ are determined such that the ratios $\delta_1$:$g_1$ and $\delta_2$:$g_2$ are about 1:8 and 1:4, respectively.

16. A system as defined in claim 15, wherein the constants $g_1$ and $g_2$ are substantially equal.

17. A system as defined in claim 16, wherein the constants $\delta_1$, $\delta_2$, $g_1$ and $g_2$ are substantially equal to 1/256, 1/128, 1/32 and 1/32, respectively.

18. A system as defined in claim 13, wherein said first predictors each have two predictor coefficients $A_1$ and $A_2$ derived in accordance with the equations:

$$A_1^{j+1} = A_1^j (1 - \delta_1) + g_1 \operatorname{sgn}(E'_j) \operatorname{sgn}(E'_{j-1}) \quad 13$$

$$A_2^{j+1} = A_2^j (1 - \delta_2) + g_2 [\operatorname{sgn}(E'_j) \operatorname{sgn}(E'_{j-2}) - \quad 14$$

$$f(A_1^j) \operatorname{sgn}(E'_j) \operatorname{sgn}(E'_{j-1})]$$

where $f(A_1^j) = 2 \operatorname{sgn}(A_1^j)$ if $|A_1^j| > \frac{1}{2}$ \quad 15

$= 4 A_1^j$ otherwise.

19. A system as defined in claim 18, wherein the constants $\delta_1$, $\delta_2$, $g_1$ and $g_2$ are determined such that the ratios $\delta_1$:$g_1$ and $\delta_2$:$g_2$ are about 1:2$\sqrt{2}$ and unity, respectively.

20. A system as defined in claim 19, wherein the constants $\delta_1$, $\delta_2$, $g_1$ and $g_2$ are about 1/181, 1/90, 1/64 and 1/90, respectively.

21. A transmitter for an adaptive differential pulse code modulation system including; a subtractor for deriving the difference $E_j$ between an input signal $X_j$ and a predicted value $X_j$, a quantizer for quantizing the difference signal $E_j$ from said subtractor to obtain a numeric representation $N_j$ thereof;

an inverse quantizer for recovering the difference signal $E_j$ from said numeric representation $N_j$;

summing means for summing the difference signal $E_j$ and the predicted value $X_j$ to provide a reconstructed signal $X_j$;

predictor means having variable prediction coefficients for receiving the output $X_j$ of said summing means and generating therefrom a predictor output signal $X_{jp}$ comprising at least partially said predicted value $X_j$; and a feedback loop for applying said predicted value to said summing means;

said predictor means being arranged to derive its predictor value $X_{jp}$ in accordance with the equation:

$$X_{jp} = A_1[X'_{j-1}]\underline{X_{j-1}} + A_2[X'_{j-2}]\underline{X_{j-2}} \cdots + A_n[X'_{j-n}]\underline{X_{j-n}} \quad 3$$

wherein $A_i$–$A_n$ are the predictor coefficient values defined by:

$$A_i^{j+1} = A_i^j(1 - \delta_i) + g \cdot F_i(E_j, E_{j-1}, \cdots E_{j-n}, A_1^j \cdots A_{i-1}^j) \quad 4$$

where
- i = the number of the particular predictor coefficient
- = 1 ... n where n is the number of coefficients;
- $\delta_i$ is a positive constant much smaller than one;
- g is a proper positive constant;
- $E_j$ is the value of the quantized difference signal at time point j;
- $A_i^j$ is the respective predictor coefficient at time point j;
- $F_i$ is a non-linear function
- $X_j$ is the sum of the difference signal $E_j$ and the predicted value $X_j$.

22. A transmitter for an adaptive differential pulse code modulation system including; a subtractor for deriving the difference $E_j$ between an input signal $X_j$ and a predicted value $\hat{X}_j$, a quantizer for quantizing the difference signal $E_j$ from said subtractor to obtain a numeric representation $N_j$ thereof;

an inverse quantizer for recovering the difference signal $\hat{E}_j$ from said numeric representation $N_j$;

summing means for summing the difference signal $\hat{E}_j$ and the predicted value $\hat{X}_j$ to provide a reconstructed signal $\tilde{X}_j$;

predictor means having variable prediction coefficients for receiving the reconstructed signal $\tilde{X}_j$ from said summing means and generating therefrom a predictor output signal $\hat{X}_{jp}$ comprising at least partially said predicted value $\hat{X}_j$; and a feedback loop for applying said predicted value to said summing means;

said predictor means being arranged to derived each prediction coefficient using an equation consisting essentially of a decay term and a non-linear function having at least one set of arguments comprising a finite number of past values of said difference signal $\hat{E}_j$ and having no arguments comprising the value of said reconstructed signal $\tilde{X}_j$.

23. A transmitter as defined in claim 21 or 22 wherein said predictor means has two predictor coefficients $A_1$ and $A_2$ derived in accordance with the equations:

$$A_1^{j+1} = A_1^j (1 - \delta_1) + g_1 \cdot E_j \cdot E_{j-1}/K_j \quad 5$$

$$A_2^{j+1} = A_2^j (1 - \delta_2) + g_2 \cdot [E_j \cdot E_{j-2} - A_1^j \cdot E_j \cdot E_{j-1}]/K_j \quad 6$$

-continued
$$K_j = \text{Max}(d, E_j^2, E_{j-1}^2, E_{j-2}^2)$$

where j is a particular sample period;
$\delta_1$ and $\delta_2$ are positive values much smaller than 1;
$g_1$ and $g_2$ and d are proper positive constants.

24. A transmitter as defined in claim 23, wherein the first said predictor means provides a part only of the predicted value and said transmitter further comprises:
second prediction means having variable coefficients and no feedback loop for providing from the regenerated difference signal ($\hat{E}_j$) a partial predicted value ($\hat{X}_{jo}$) and
a second adder for summing the output of the first-mentioned predictor means and the partial predicted value to provide said predicted value.

25. A transmitter as defined in claim 23, wherein the constants $\delta_1$, $\delta_2$, $g_1$ and $g_2$ are determined such that the ratios $\delta_1:g_1$ and $\delta_2:g_2$ are about 1:8 and 1:4, respectively.

26. A transmitter as defined in claim 25, wherein the constants $g_1$ and $g_2$ are substantially equal.

27. A transmitter as defined in claim 26, wherein the constants $\delta_1$, $\delta_2$, $g_1$ and $g_2$ are substantially equal to 1/256, 1/128, 1/32 and 1/32, respectively.

28. A transmitter as defined in claim 21 or 22, wherein said predictors each have two predictor coefficients $A_1$ and $A_2$ derived in accordance with the equations:

$$A_1^{j+1} = A_1^j(1 - \delta_1) + g_1 \text{ sgn}(\hat{E}_j) \text{ sgn}(\hat{E}_{j-1}) \quad 8$$

$$A_2^{j+1} = A_2^j(1 - \delta_2) + g_2 [\text{sgn}(\hat{E}_j) \text{ sgn}(\hat{E}_{j-2}) - \quad 9$$

$$f(A_1^j) \text{ sgn}(\hat{E}_j) \text{ sgn}(\hat{E}_{j-1})]$$

where $f(A_1^j) = 2 \text{ sgn}(A_1^j)$ if $|A_1^j| > \frac{1}{2}$ \quad 10

$= 4 A_1^j$ otherwise.

29. A transmitter as defined in claim 28, wherein the first said predictor means provides a part only of the predicted value and said transmitter further comprises:
second prediction means having variable coefficients and no feedback loop for providing from the regenerated difference signal ($\hat{E}_j$) a partial predicted value ($\hat{X}_{jo}$) and
a second adder for summing the output of the first-mentioned predictor means and the partial predicted value to provide said predicted value.

30. A transmitter as defined in claim 28, wherein the constants $\delta_1$, $\delta_2$, $g_1$ and $g_2$ are determined such that the ratios $\delta_1:g_1$ and $\delta_2:g_2$ are about $1:2\sqrt{2}$ and unity, respectively.

31. A transmitter as defined in claim 30, wherein the constants $\delta_1$, $\delta_2$, $g_1$ and $g_2$ are about 1/181, 1/90, 1/64 and 1/90, respectively.

32. A transmitter as defined in claim 21, wherein the first said predictor means provides a part only of the predicted value and said transmitter further comprises:
second prediction means having variable coefficients and no feedback loop for providing from the regenerated difference signal ($\hat{E}_j$) a partial predicted value ($\hat{X}_{jo}$) and
a second adder for summing the output of the first-mentioned predictor means and the partial predicted value to provide said predicted value.

33. A transmitter for an adaptive differential pulse code modulation system including; a subtractor for deriving the difference $E_j$ between an input signal $X_j$ and a predicted value $\hat{X}_j$, a quantizer for quantizing the difference signal $E_j$ from said subtractor to obtain a numeric representation $N_j$ thereof;
an inverse quantizer for recovering the difference signal $\hat{E}_j$ from said numeric representation $N_j$;
summing means for summing the difference signal $\hat{E}_j$ and the predicted value $\hat{X}_j$;
first predictor means having variable prediction coefficients for receiving the reconstructed signal $\tilde{X}_j$ from said summing means and generating therefrom a predictor output signal $\hat{X}_{jp}$ comprising a part of said predicted value $\hat{X}_j$; and
a feedback loop for applying said predicted value $\hat{X}_j$ to said first summing means;
second predictor means having variable coefficients and no feedback loop for providing from the regenerated difference signal ($\hat{E}_j$) a partial predicted value ($\hat{X}_{jo}$);
a second summing means for summing the respective outputs ($\hat{X}_{jp}$ and $\hat{X}_{jo}$) of the first predictor means and the second predictor means to provide said predicted value $\hat{X}_j$;
third summing means for deriving the sum $E'_j$ of the quantized difference signal $\hat{E}_j$ and the partial predicted value ($\hat{X}_{jo}$) from said second predictor means;
said first predictor means being arranged to derive its predictor value $\hat{X}_{jp}$ in accordance with the equation:

$$X_{jp} = A_1[X'_{j-1}]\underline{X_{j-1}} + A_2[X'_{j-2}]\underline{X_{j-2}} \cdots + A_n[X'_{j-n}]\underline{X_{j-n}}^3$$

wherein $A_i$–$A_n$ are the predictor coefficient values defined by:

$$A_i^{j+1} = A_i^j(1 - \delta_i) + g \cdot F_i(E'_j, E'_{j-1}, \cdots E'_{j-n}, A_i^j \cdots A_{i-1}^j) \quad 4$$

where
i = the number of the particular predictor coefficient
= 1 ... n where n is the number of coefficients;
$\delta_i$ is a positive constant much smaller than one;
g is a proper positive constant;
$E'_j$ is the sum of the quantized difference signal $\hat{E}_j$ at time j and the output $\hat{X}_{jo}$ of said second predictor means;
$A_i^j$ is the respective predictor coefficient at time point j;
$F_i$ is a non-linear function;
$\tilde{X}_j$ is the sum of the difference signal $\hat{E}_j$ and the predicted value $\hat{X}_j$.

34. A transmitter as defined in claim 33, including predictors each having two predictor coefficients $A_1$ and $A_2$ derived in accordance with the equations:

$$A_1^{j+1} = A_1^j(1 - \delta_1) + g_1 \cdot E'_j \cdot E'_{j-1}/K_j \quad 11$$

$$A_2^{j+1} = A_2^j(1 - \delta_2) + g_2 \cdot [E'_j \cdot E'_{j-2} - A_1^j \cdot E'_j \cdot E'_{j-1}]/K_j \quad 12$$

$$K_j = \text{Max}(d, E_j^2, E_{j-1}^2, E_{j-2}^2)$$

where j is a particular sample period;
$\delta_1$ and $\delta_2$ are positive values much smaller than 1;
$g_1$ and $g_2$ and d are proper positive constants.

35. A transmitter as defined in claim 34, wherein the constants $\delta_1$, $\delta_2$, $g_1$ and $g_2$ are determined such that the ratios $\delta_1:g_1$ and $\delta_2:g_2$ are about 1:8 and 1:4, respectively.

36. A transmitter as defined in claim 35, wherein the constants $g_1$ and $g_2$ are substantially equal.

37. A transmitter as defined in claim 36, wherein the constants $\delta_1$, $\delta_2$, $g_1$ and $g_2$ are substantially equal to 1/256, 1/128, 1/32 and 1/32, respectively.

38. A transmitter as defined in claim 33, including predictors each having two predictor coefficients $A_1$ and $A_2$ derived in accordance with the equations:

$$A_1^{j+1} = A_1^j (1 - \delta_1) + g_1 \operatorname{sgn}(E'_j) \operatorname{sgn}(E'_{j-1}) \qquad 13$$

$$A_2^{j+1} = A_2^j (1 - \delta_2) + g_2 [\operatorname{sgn}(E'_j) \operatorname{sgn}(E'_{j-2}) - \qquad 14$$

$$f(A_1^j) \operatorname{sgn}(E'_j) \operatorname{sgn}(E'_{j-1})]$$

where $f(A_1^j) = 2 \operatorname{sgn}(A_1^j)$ if $|A_1^j| > \tfrac{1}{2}$  15

$\qquad = 4 A_1^j$ otherwise.

39. A transmitter as defined in claim 38, wherein the constants $\delta_1$, $\delta_2$, $g_1$ and $g_2$ are determined such that the ratios $\delta_1 : g_1$ and $\delta_2 : g_2$ are about $1 : 2\sqrt{2}$ and unity, respectively.

40. A tramsmitter as defined in claim 39, wherein the constants $\delta_1$, $\delta_2$, $g_1$ and $g_2$ are about 1/181, 1/90, 1/64 and 1/90, respectively.

41. A receiver for an adaptive differential pulse code modulation system comprising an inverse quantizer for recovering a receiver quantized difference signal $E_j$ from a received numeric representation $N_j$;

an adder for combining a receiver predicted value $X_j$ and a receiver quantized difference signal $E_j$ to provide a reconstructed signal $X_j$;

receiver predictor means having variable prediction coefficients, for receiving said reconstructed signal and providing therefrom a predictor output comprising at least partially said receiver predicted value;

said predictor means being arranged to derive its predictor output $\hat{X}_{jp}$ in accordance with the equation:

$$\hat{X}_{jp} = A_1[X'_{j-1}]\underline{X_{j-1}} + A_2[X'_{j-2}]\underline{X_{j-2}} \cdots + A_n[X'_{j-n}]\underline{X_{j-n}}^3$$

wherein $A_i$–$A_n$ are the predictor coefficient values defined by:

$$A_i^{j+1} = A_i^j(1 - \delta_i) + g \cdot F_i(\hat{E}_j, \hat{E}_{j-1}, \cdots \hat{E}_{j-n}, A_1^j \cdots A_{i-1}^j) \qquad 4$$

where
i = the number of the predictor coefficient
= 1–n where n is the number of coefficients;
$\delta_i$ is a positive constant much smaller than one;
g is a proper positive constant;
$\hat{E}_j$ is the value of the quantized difference signal at time point j;
$A_i^j$ is the respective predictor coefficient at time point j;
$F_i$ is a non-linear function;
$\tilde{X}_j$ is the sum of the difference signal $\hat{E}_j$ and the predicted value $\hat{X}_j$.

42. A receiver for an adaptive differential pulse code modulation system comprising an inverse quantizer for recovering a receiver quantized difference signal $\hat{E}_j$ from a received numeric representation $N_j$;

an adder for combining a receiver predicted value $\hat{X}_j$ and a receiver quantized difference signal $\hat{E}_j$ to provide a reconstructed signal $\tilde{X}_j$;

receiver predictor means having variable prediction coefficients, for receiving said reconstructed signal and providing therefrom a predictor output comprising at least partially said receiver predicted value;

said predictor means being arranged to derive each predictor coefficient using an equation consisting essentially of a decay term and a non-linear function having at least one set of arguments comprising a finite number of past values of said difference signal $\hat{E}_j$ and having no arguments comprising the value of said reconstructed signal $\tilde{X}_j$.

43. A receiver as defined in claim 41 or 42 wherein said predictor means has two predictor coefficients $A_1$ and $A_2$ derived in accordance with the equations:

$$A_1^{j+1} = A_1^j (1 - \delta_1) + g_1 \cdot [\hat{E}_j \cdot \hat{E}_{j-1}/K_j \qquad 5$$

$$A_2^{j+1} = A_2^j (1 - \delta_2) + g_2 \cdot [\hat{E}_j \cdot \hat{E}_{j-2} - A_1^j \cdot \hat{E}_j \cdot \hat{E}_{j-1}]/K_j \qquad 6$$

$$K_j = \operatorname{Max}(d, \hat{E}_j^2, \hat{E}_{j-1}^2, \hat{E}_{j-2}^2)$$

where
j is a particular sample period;
$\delta_1$ and $\delta_2$ are positive values much smaller than 1;
$g_1$ and $g_2$ and d are proper positive constants.

44. A receiver as defined in claim 43, wherein the first said predictor means provides a part only of the predicted value and said receiver further comprises:

second predictor means having variable coefficients and no feedback loop for providing from the regenerated difference signal $(\hat{E}_j)$ a partial predicted value $(\hat{X}_{jo})$ and a second adder for summing the output of the first-mentioned predictor means and the partial predicted value to provide said predicted value.

45. A receiver as defined in claim 43, wherein the constants $\delta_1$, $\delta_2$, $g_1$ and $g_2$ are determined such that the ratios $\delta_1 : g_1$ and $\delta_2 : g_2$ are about 1:8 and 1:4, respectively.

46. A receiver as defined in claim 45, wherein the constants $g_1$ and $g_2$ are substantially equal.

47. A receiver as defined in claim 46, wherein the constants $\delta_1$, $\delta_2$, $g_1$ and $g_2$ are substantially equal to 1/256, 1/128, 1/32 and 1/32, respectively.

48. A receiver as defined in claim 41 or 42, wherein said predictors each have two predictor coefficients $A_1$ and $A_2$ derived in accordance with the equations:

$$A_1^{j+1} = A_1^j (1 - \delta_1) + g_1 \operatorname{sgn}(\hat{E}_j) \operatorname{sgn}(\hat{E}_{j-1}) \qquad 8$$

$$A_2^{j+1} = A_2^j (1 - \delta_2) + g_2 [\operatorname{sgn}(\hat{E}_j) \operatorname{sgn}(\hat{E}_{j-2}) - \qquad 9$$

$$f(A_1^j) \operatorname{sgn}(\hat{E}_j) \operatorname{sgn}(\hat{E}_{j-1})]$$

where $f(A_1^j) = 2 \operatorname{sgn}(A_1^j)$ if $|A_1^j| > \tfrac{1}{2}$  10

$\qquad = 4 A_1^j$ otherwise.

49. A receiver as defined in claim 48, wherein the first said predictor means provides a part only of the predicted value and said receiver further comprises:

second predictor means having variable coefficients and no feedback loop for providing from the regenerated difference signal $(\hat{E}_j)$ a partial predicted value $(\hat{X}_{jo})$ and a second adder for summing the output of the first-mentioned predictor means and the partial predicted value to provide said predicted value.

50. A receiver as defined in claim 48, wherein the constants $\delta_1$, $\delta_2$, $g_1$ and $g_2$ are determined such that the ratios $\delta_1:g_1$ and $\delta_2:g_2$ are about $1:2\sqrt{2}$ and unity, respectively.

51. A receiver as defined in claim 50, wherein the constants $\delta_1$, $\delta_2$, $g_1$ and $g_2$ are about 1/181, 1/90, 1/64 and 1/90, respectively.

52. A receiver as defined in claim 41, wherein the first said predictor means provides a part only of the predicted value and said receiver further comprises:
   second predictor means having variable coefficients and no feedback loop for providing from the regenerated difference signal ($\hat{E}_j$) a partial predicted value ($\hat{X}_{jo}$) and
   a second adder for summing the output of the first-mentioned predictor means and the partial predicted value to provide said predicted value.

53. A receiver for an adaptive differential pulse code modulation system comprising an inverse quantizer for recovering a receiver quantized difference signal $E_j$ from a received numeric representation $N_j$;
   an adder for combining a receiver predicted value $X_j$ and a receiver quantized difference signal $E_j$ to provide a reconstructed signal $\tilde{X}_j$;
   first receiver predictor means having variable prediction coefficients, for receiving said reconstructed signal $X_j$ and providing therefrom a predictor output ($\hat{X}_{jp}$) comprising a part of said receiver predicted value;
   a feedback loop for applying said predicted value ($X_j$) to said first receiver summing means;
   second predictor means having variable coefficients and no feedback loop for providing from the regenerated difference signal ($\hat{E}_j$) a partial predictor value ($\hat{X}_{jo}$);
   a second summing means for summing the respective outputs ($X_{jp}$ and $X_{jo}$) of the first predictor means and the second predictor means to provide said predictor value $\hat{X}_j$;
   third summing means for deriving the sum $E'_j$ of the quantized difference signal $\hat{E}_j$ and the partial predicted value ($\hat{X}_{jo}$) from said second predictor means;
   said first predictor means being arranged to derive its predictor value $\hat{X}_{jp}$ in accordance with the equation:

$$\hat{X}_{jp} = A_1[X'_{j-1}]\tilde{X}_{j-1} + A_2[\tilde{X}_{j-2}]\tilde{X}_{j-2} \cdots + A_n[X'_{j-n}]\tilde{X}_{j-n}^3$$

wherein $A_i$-$A_n$ are the predictor coefficient values defined by:

$$A_i^{j+1} = A_i^j(1 - \delta_i) + g \cdot F_i(\hat{E}'_j, \hat{E}_{j-1}, \cdots \hat{E}_{j-n}, A_i^j \cdots A_{i-1}^j) \qquad 4$$

where i = the number of the particular predictor coefficient = 1 ... n where n is the number of coefficients;
$\delta_i$ is a positive constant much smaller than one;
g is a proper positive constant;
$E'_j$ is the sum of the quantized difference signal $\hat{E}_j$ at time j and the output $\hat{X}_{jo}$ of said second predictor means;
$A_i^j$ is the respective predictor coefficient at time point j;
$F_i$ is a non-linear function;
$\tilde{X}_j$ is the sum of the difference signal $\hat{E}_j$ and the predicted value $\hat{X}_j$.

54. A receiver as defined in claim 53, wherein each said first predictor has two predictor coefficients $A_1$ and $A_2$ derived in accordance with the equations:

$$A_1^{j+1} = A_1^j (1 - \delta_1) + g_1 \cdot E'_j \cdot E_{j-1}/K_j \qquad 11$$

$$A_2^{j+1} = A_2^j (1 - \delta_2) + g_2 \cdot [E'_j \cdot E_{j-2} - A_1^j \cdot E'_j \cdot E_{j-1}]/K_j \qquad 12$$

$$K_j = \text{Max}(d, E_j^2, E_{j-1}^2, E_{j-2}^2)$$

where j is a particular sample period;
$\delta_1$ and $\delta_2$ are positive values much smaller than 1;
$g_1$ and $g_2$ and d are proper positive constants.

55. A receiver as defined in claim 54, wherein the constants $\delta_1$, $\delta_2$, $g_1$ and $g_2$ are determined such that the ratios $\delta_1:g_1$ and $\delta_2:g_2$ are about 1:8 and 1:4, respectively.

56. A receiver as defined in claim 55, wherein the constants $g_1$ and $g_2$ are substantially equal.

57. A receiver as defined in claim 56, wherein the constants $\delta_1$, $\delta_2$, $g_1$ and $g_2$ are substantially equal to 1/256, 1/128, 1/32 and 1/32, respectively.

58. A receiver as defined in claim 53, including predictors each having two predictor coefficients $A_1$ and $A_2$ derived in accordance with the equations:

$$A_1^{j+1} = A_1^j (1 - \delta_1) + g_1 \, \text{sgn}\,(E'_j)\, \text{sgn}\,(E'_{j-1}) \qquad 13$$

$$A_2^{j+1} = A_2^j (1 - \delta_2) + g_2\, [\text{sgn}(E'_j)\, \text{sgn}\,(E'_{j-2}) - \qquad 14$$

$$f(A_1^j)\, \text{sgn}\,(E'_j)\, \text{sgn}\,(E'_{j-1})]$$

where $f(A_1^j) = 2\, \text{sgn}\,(A_1^j)$ if $|A_1^j| > \frac{1}{2}$ \qquad 15

$= 4\, A_1^j$ otherwise.

59. A receiver as defined in claim 58, wherein the constants $\delta_1$, $\delta_2$, $g_1$ and $g_2$ are determined such that the ratios $\delta_1:g_1$ and $\delta_2:g_2$ are about $1:2\sqrt{2}$ and unity, respectively.

60. A receiver as defined in claim 59, wherein the constants $\delta_1$, $\delta_2$, $g_1$ and $g_2$ are about 1/181, 1/90, 1/64 and 1/90, respectively.

* * * * *